(12) United States Patent
Chang

(10) Patent No.: US 11,799,220 B2
(45) Date of Patent: Oct. 24, 2023

(54) MULTIPLEX CONTROL DEVICE HAVING REDRIVER CHIP AND THE REDRIVER CHIP THEREOF

(71) Applicants: MICRO-STAR INT'L CO.,LTD., New Taipei (TW); MSI COMPUTER (SHENZHEN) CO.,LTD., Shenzhen (CN)

(72) Inventor: Chung-Hsing Chang, New Taipei (TW)

(73) Assignees: MICRO-STAR INT'L CO., LTD., New Taipei (TW); MSI COMPUTER (SHENZHEN) CO., LTD., Shenzhen (CN)

( * ) Notice: Subject to any disclaimer, the term of this patent is extended or adjusted under 35 U.S.C. 154(b) by 413 days.

(21) Appl. No.: 17/324,817

(22) Filed: May 19, 2021

(65) Prior Publication Data

US 2022/0320767 A1    Oct. 6, 2022

(30) Foreign Application Priority Data

Mar. 31, 2021   (TW) .................................. 110111767

(51) Int. Cl.
*H01R 12/70*   (2011.01)

(52) U.S. Cl.
CPC ............... *H01R 12/7076* (2013.01)

(58) Field of Classification Search
CPC .................................................. H01R 12/7076
See application file for complete search history.

(56) References Cited

U.S. PATENT DOCUMENTS

| | | | |
|---|---|---|---|
| 2020/0409444 A1* | 12/2020 | Delshadpour | H04L 25/0298 |
| 2022/0171730 A1* | 6/2022 | Lendvay | G11C 11/4096 |

* cited by examiner

*Primary Examiner* — Duc C Ho
(74) *Attorney, Agent, or Firm* — Maschoff Brennan

(57) ABSTRACT

A redriver chip comprising: pre-stage transmission pin sets, pre-stage reception pin sets, post-stage transmission pin sets, post-stage reception pin sets and selectors. The pre-stage transmission pin sets and the pre-stage reception pin sets are disposed in alternating arrangement, and the post-stage transmission pin sets and the post-stage reception pin sets are disposed in alternating arrangement. The amount of the post-stage transmission pin sets is an integral multiple of the amount of pre-stage reception pin sets, and the amount of the pre-stage reception pin sets is an integral multiple of the pre-stage transmission pin sets. Each of the selectors is connected to one of the pre-stage reception pin sets and integral multiple amount of the post-stage transmission pin sets, or is connected to one of the pre-stage transmission pin sets and integral multiple amount of the post-stage reception pin sets.

6 Claims, 5 Drawing Sheets

MULTIPLEX CONTROL DEVICE HAVING REDRIVER CHIP AND THE REDRIVER CHIP THEREOF

CROSS-REFERENCE TO RELATED APPLICATIONS

This non-provisional application claims priority under 35 U.S.C. § 119(a) on Patent Application No(s). 110111767 filed in ROC on Mar. 31, 2021, the entire contents of which are hereby incorporated by reference.

BACKGROUND

1. Technical Field

This disclosure relates to a multiplex control device, and particularly to a multiplex control device having a redriver chip and the redriver chip thereof.

2. Related Art

In the field of communication, the strength of the signal decreases gradually as the transmission length increases, so that a repeater, which is capable to amplify the signal, then is disposed between the start and end of the signal transmission in order to extend the distance the signal can be transmitted, wherein the repeater may usually be implemented as a redriver chip. According to a control signal, a common redriver chip is capable to transmit the signals received from the transmission pins (Tx) of the pre-stage component (e.g. processor) to the post-stage component (e.g. Peripheral Component Interconnect Express, PCIe), or transmit the signals received from the post-stage component to the reception pins (Rx) of the pre-stage component. In recent years, the release of the new PCIe specification after PCIe version 4.0 is getting faster, and the transmission rate of the new version of PCIe has also increased. As the result, the common redriver chip is no longer capable to provide sufficient transmission performance under the new PCIe specification, and may generate too much noise when it is disposed between the pre-stage component and the post-stage component for signal communication. Therefore, in response, the manufacturers of the redriver chip have to develop the redriver chip with faster transmission rate.

In the conventional motherboard with the above-mentioned redriver chip, the Tx and Rx of the processor, for example, produced by Intel, are alternately arranged. In the layout structure from the processor to the redriver chip of the motherboard, multiple transmission (TX) lines and multiple reception (RX) lines may be arranged to overlap with each other first, then the TX lines and the RX lines are respectively gathered according to the pin setting of the redriver chip, and then the TX lines and the RX lines are connected to the redriver chip. However, the structure aforementioned may cause uncertainty and difficulty when the layout is designed, and even increase the number of circuit layer changes (e.g. change between the upper and lower layer of the circuit board). Also, transmission lines in the same signal flow direction that are separated by a distance shorter than a certain distance are likely to cause greater far-end crosstalk (FEXT), which makes each transmission line suffer more severe noise interference, which in turn affects the transmission quality.

SUMMARY

Accordingly, to satisfy the demand abovementioned, this disclosure provides a redriver chip, which includes: a plurality of pre-stage reception pin sets, configured to receive a set of pre-stage signals from a pre-stage component; a plurality of pre-stage transmission pin sets, configured to transmit a set of post-stage signals to the pre-stage component, wherein the plurality of pre-stage transmission pin sets and the plurality of pre-stage reception pin sets are arranged alternately; a plurality of post-stage transmission pin sets, wherein the amount of the plurality of post-stage transmission pin sets is N times the amount of the plurality of the pre-stage reception pin sets, and part of the plurality of post-stage transmission pin sets are configured to transmit the set of pre-stage signals to one of a plurality of the post-stage components; a plurality of post-stage reception pin sets, wherein the amount of the plurality of post-stage reception pin sets is N times the amount of the plurality of the pre-stage transmission pin sets, part of the plurality of post-stage reception pin sets are configured to receive the set of post-stage signals from one of the plurality of post-stage component, and the plurality of post-stage reception pin sets and the plurality of post-stage transmission pin sets are arranged alternately; and a plurality of selectors, wherein each of the plurality of selectors is connected to one of the plurality of pre-stage reception pin sets and N of the plurality of post-stage transmission pin sets, or is connected to one of the plurality of pre-stage transmission pin sets and N of the plurality of post-stage reception pin sets, wherein each set of the plurality of pre-stage reception pin sets, the plurality of pre-stage transmission pin sets, the plurality of post-stage transmission pin sets and the plurality of post-stage reception pin sets corresponds to any one of the plurality of selectors.

This disclosure also provides a multiplex control device having a redriver chip, which includes: a processor, including a plurality of processing transmission pin sets and a plurality of processing reception pin sets, wherein the plurality of processing transmission pin sets and the plurality of processing reception pin sets are arranged alternately; a first connecting port, including a plurality of first secondary transmission pin sets and a plurality of first secondary reception pin sets, wherein the plurality of first secondary transmission pin sets and the plurality of first secondary reception pin sets are arranged alternately; a second connecting port, including a plurality of second secondary transmission pin sets and a plurality of second secondary reception pin sets, wherein the plurality of second secondary transmission pin sets and the plurality of second secondary reception pin sets are arranged alternately; and the redriver chip as mentioned above wherein the processor serves as the pre-stage component, and the plurality of post-stage components includes the first connecting port and the second connecting port. The processor transmits the set of pre-stage signals to the plurality of pre-stage reception pin sets by the plurality of processing transmission pin sets, and receives the set of post-stage signals from the plurality of pre-stage transmission pin sets by the plurality of processing reception pin sets. The redriver chip transmits the set of pre-stage signals to the plurality of first secondary reception pin sets or the plurality of secondary reception pin sets by the part of the plurality of the post-stage transmission pin sets, and receives the set of post-stage signals from the plurality of first secondary transmission pin sets or the plurality of second secondary transmission pin sets by the part of the plurality of post-stage reception pin sets.

In view of the above description, the redriver chip in this disclosure includes the pin sets with alternately arrangement, so that the amplitude of the FEXT caused by transmission lines of the same type (in the same transmission direction) being too close may be dramatically decreased, and accordingly, the layout structure may be simplified or the amount of the layer may be decreased. Besides, as the result of the redriver chip in this disclosure including pre-stage transmission pin sets, pre-stage reception pin sets, post-stage transmission pin sets and post-stage reception pin sets, only one redriver chip aforementioned may be installed on the multiplex control device having the redriver chip, or more redriver chip aforementioned may be installed on the multiplex control device having the redriver chip as needed, so that the flexibility of layout may be improved.

BRIEF DESCRIPTION OF THE DRAWINGS

This disclosure will become more fully understood from the detailed description given hereinbelow and the accompanying drawings which are given by way of illustration only and thus are not limitative of this disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
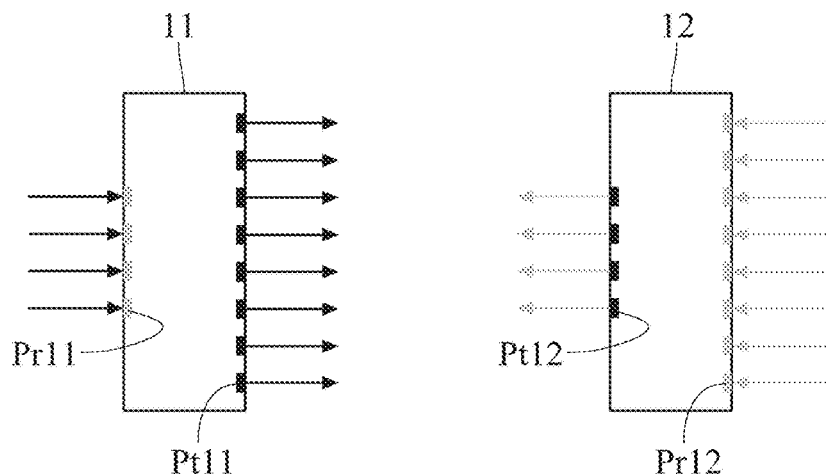
FIG. 1 is a schematic diagram of a redriver chip in an implementation architecture in the development process according to this invention.

Please refer to FIG. 1 which is a schematic diagram of the architecture of the redriver chip in an implementation architecture in the development process according to this invention. A redriver chip may usually be disposed in the layout structure between the processor and the peripheral component interconnect express (PCIe), and be configured to amplify the signal and extend the distance the signal can be transmitted, wherein the redriver chip may be one of the two redriver chips shown in the FIG. 1, that is, the transmitting redriver chip 11 on the left or the receiving redriver chip 12 on the right. The black lines and the gray lines in FIG. 1 exemplarily show the signal flows between the surrounding component and the redriver chips, wherein the black lines represent transmission (TX) lines and the gray lines represent reception (RX) lines). Whether the line is a TX line or RX line is determined from the perspective of the upstream device (e.g. processor) connected to the transmitting redriver chips 11 or the receiving redriver chip 12. For example, the TX lines represent that the upstream device transmits the signals and the redriver chip receives the signals, and the RX lines represent that the upstream device receives the signals transmitting from the redriver chip. The TX lines and RX lines are defined basing on this principle in the following description paragraphs and drawings.

As shown in FIG. 1, one end (e.g. the left end) of the transmitting redriver chip 11 may include multiple first reception pin sets Pr11, configured to receive multiple signals transmitted from, for example, the processor, and the other end (e.g. the right end) of the transmitting redriver chip 11 may include multiple first transmission pin sets Pt11, configured to transmit the signals aforementioned. The amount of the first transmission pin sets Pt11 may be N times the amount of the first reception pin sets Pr11, wherein N is an integer greater than 1. As the transmission redriver chip 11 shown in FIG. 1, the amount of the first transmission pin sets Pt11 is, for example, twice the amount of the first reception pin sets Pr11, and the first reception pin sets Pr11 correspond to the first transmission pin sets Pt11 in a one-to-two manner. The transmission redriver chip 11 further includes multiple selectors (not shown in the drawing), composed of multiple demultiplexers (DEMUX), each corresponding to one first reception pin set Pr11 and two first transmission pin sets Pt11. Each DEMUX selects one of the two first transmission pin sets Pt11 and transmits the signal received from the first reception pin set Pr11 to the selected first transmission pin set Pt11 every preset unit time. It should be noted that the positions of the first transmission pin sets Pt11 and the first reception pin sets Pr11 are not limited in this invention. The first transmission pin sets Pt11 and the first reception pin sets Pr11 may be disposed on any end of the transmission redriver chip 11 according to the layout design.

As shown in FIG. 1, the other end (e.g. the right end) of the receiving redriver chip 12 may include multiple second reception pin sets Pr12, configured to receive the signals transmitted from, for example, the PCIe, and the other end (e.g. the left end) of the receiving redriver chip 12 may include multiple second transmission pin sets Pt12, configured to transmit the signals aforementioned. The amount of the second reception pin sets Pr11 may be N times the amount of the second transmission pin sets Pt12, wherein N is an integer greater than 1. As the reception redriver chip 12 shown in FIG. 1, the amount of the second reception pin sets Pr12 is, for example, twice the amount of the second transmission pin sets Pt12, and the second reception pin sets Pr12 correspond to the second transmission pin sets Pt12 in a two-to-one manner. The reception redriver chip 12 further includes multiple selectors (not shown in the drawing), composed of multiple multiplexers (MUX), each corresponding to two second reception pin sets Pr12 and one second transmission pin set Pt12. After receiving the two corresponding signals transmitted from the second reception pin sets Pr12, each MUX selects one of the two signals and transmit the signal to the second transmission pin set Pt12 on the other end (e.g. the left end) of the reception redriver chip 12. It should be noted that the position of the second transmission pin sets Pt12 and the second reception pin sets Pr12 are not limited in this invention. The second transmission pin sets Pt12 and the second reception pin sets Pr12 are disposed on any end of the reception redriver chip 12 according to the layout design.

In addition, it should be noted that the components for transmitting or receiving signals are defined as "pin set" rather than simply "pin" because either the TX line or the RX line in the related field transmit or receive differential signals in practice, which means two single-ended signal lines are required to transmit or receive single-frequency signals with the same voltage amplitude one of which is positive and the other one is negative, and one end of each of the two signal lines is connected to a pin. Therefore, for the transmission redriver chip 11, reception redriver chip 12 and the components described below, two pins are required to completely implement the TX end or the RX end. Accordingly, the pin set may include two pins.

Figure 2:
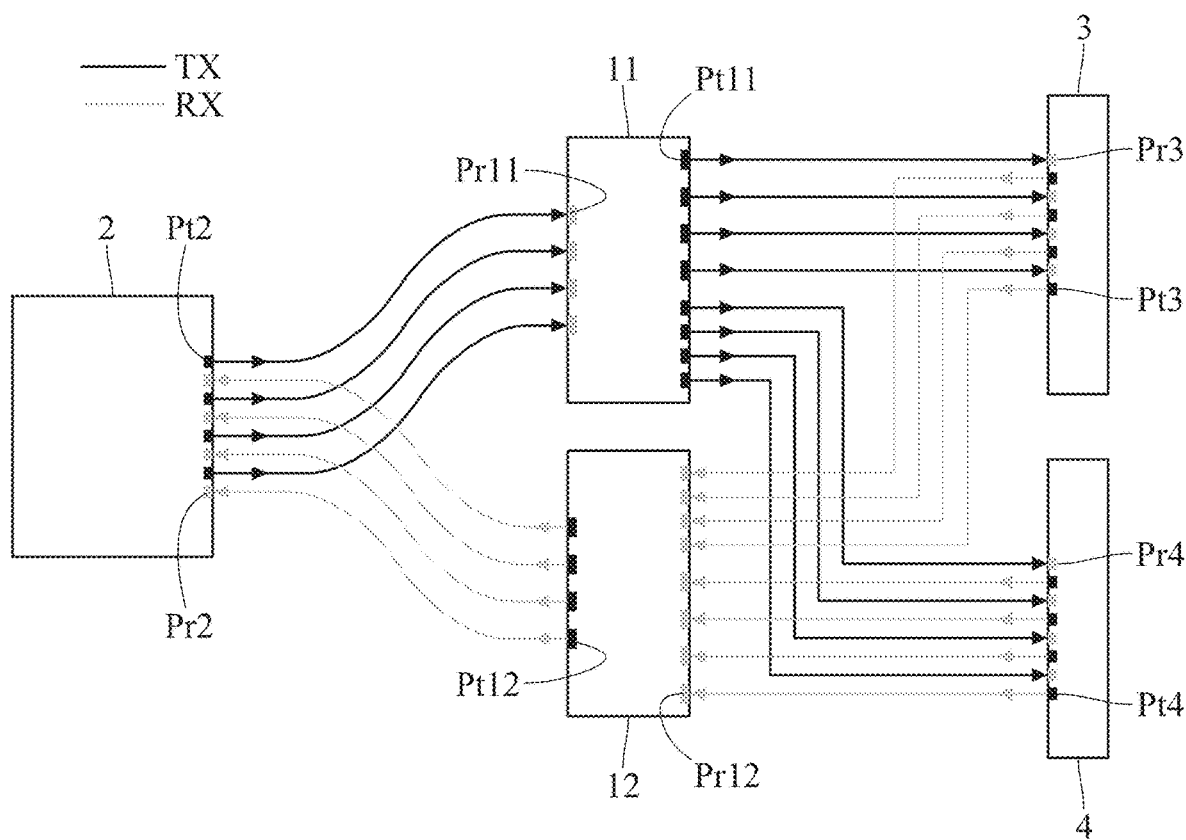
FIG. 2 is a schematic diagram of the multiplex control device having two redriver chips of the FIG. 1 in an implementation architecture in the development process according to this invention.

Please refer to FIG. 2, which is a schematic diagram of the architecture of the multiplex control device having two redriver chips of the FIG. 1 in an implementation architecture in the development process according to this invention. Please note that for the convenience of description, each single black/gray line is illustrated but not limited to represent signal lines whose two ends are each connected to a pin set. The multiplex control device in FIG. 2 includes: a transmitting redriver chip 11, a receiving redriver chip 12, a processor 2, a first connecting port 3 and a second connecting port 4. The processor 2 includes multiple processing transmission pin sets Pt2 and multiple processing reception pin sets Pr2, wherein the processing transmission pin sets Pt2 and multiple processing reception pin sets Pr2 are arranged alternately. Herein, the signals transmitted from the upstream device (e.g. processor 2) to the downstream device (e.g. first connecting port 3 or second connecting port 4) are defined as the pre-stage signals, and the signals transmitted from the downstream device to the upstream device are defined as the post-stage signals. The processor 2 transmits multiple sets of pre-stage signals to the first reception pin sets Pr11 by the processing transmission pin sets Pt2 and receives multiple sets of post-stage signals from the second transmission pin sets by the processing reception pin sets Pr2.

In an embodiment of this invention, the first connecting port 3 and the second connecting port 4 may be PCIe. Taking the conventional multiplex control device shown in FIG. 2 for example, part of the first transmission pin sets Pt11 transmit the pre-stage signals to the first connecting port 3, and another part of the first transmission pin sets Pt11 may transmit the pre-stage signals to the second connecting port 4. Besides, part of the second reception pin sets Pr12 may receive the post-stage signals from the first connecting port 3, and another part of the second reception pin sets Pr12 may receive the post-stage signals from the second connecting port 4. However, in the structure as shown in FIG. 2, for the purpose that the processor 2 is capable to perform the signal transmission and reception with the post-stage component such as the first connecting port and the second connecting port 4, at least one transmission redriver chip 11 merely responsible for the transmission and reception of the pre-stage signals and at least one reception redriver chip 12 merely for the transmission and reception of the post-stage signals are needed to be disposed between the processor 2 and the two connecting ports. In addition, to avoid a larger FEXT caused by the same type transmission lines being too close, the circuit in the printed circuit board is usually layered in the implementation of the above-mentioned structure, which may cause some difficulties in layout design.

Figure 3:
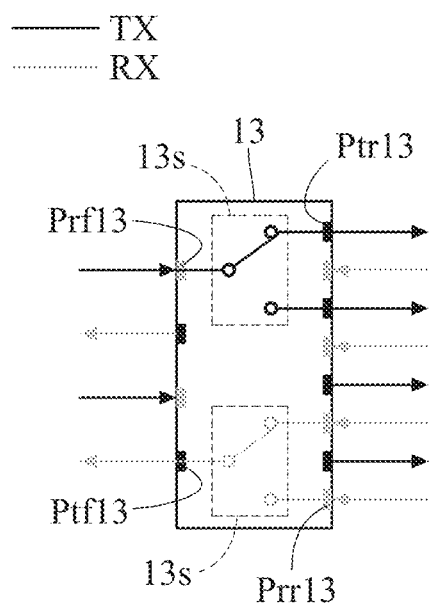
FIG. 3 is a schematic diagram of a redriver chip according to an embodiment of this invention.

Accordingly, an interleaved redriver chip is provided in this invention. Please refer to FIG. 3, which is a schematic diagram of a redriver chip 13 according to an embodiment of this invention. The redriver chip 13 in FIG. 3 may include multiple pre-stage reception pin sets Prf13 and multiple pre-stage transmission pin sets Ptf13 while all of the pre-stage reception pin sets Prf13 and pre-stage transmission pin sets Ptf13 are disposed on one end (e.g. the left end) of the redriver chip 13, wherein the pre-stage transmission pin sets Ptf13 and the pre-stage reception pin sets Prf13 are arranged alternately. The pre-stage reception pin sets Prf13 are configured to receive a set of the pre-stage signals from a pre-stage component (e.g. processor) and the pre-stage transmission pin sets Ptf13 are configured to receive a set of post-stage signals from the post-stage component. The redriver chip 13 may further include multiple post-stage transmission pin sets Ptr13 and multiple post-stage reception pin sets Prr13 while all of the post-stage transmission pin sets Ptr13 and post-stage reception pin sets Prr13 are disposed on the other end (e.g. the right end) of the redriver chip 13, wherein the post-stage reception pin sets Prr13 and the post-stage transmission pin sets Ptr13 are arranged alternately. The amount of the post-stage transmission pin sets Ptr13 is N times the amount of the pre-stage reception pin sets Prf13 and the amount of the post-stage reception pin sets Prr13 is N times the amount of the pre-stage transmission pin sets Ptf13, wherein N is an integer. In FIG. 3, N may be 2, wherein the pre-stage reception pin sets Prf13 correspond to the post-stage transmission pin sets Ptr13 in a one-to-two manner, and the pre-stage transmission pin sets Ptf13 also correspond to the post-stage reception pin sets Prr13 in a one-to-two manner. The redriver chip 13 further includes multiple selectors s13 (FIG. 3 simply shows two sets of selectors, but in practice, it may include more than two selectors), and the selectors s13 may include multiple demultiplexers (drawn with black lines) and multiple multiplexers (drawn with gray lines), wherein the demultiplexers and the multiplexers are arranged alternately. In detail, the selector s13 connected to one of the pre-stage reception pin sets Prf13 and N (e.g. 2) of the post-stage transmission pin sets Ptr13 may be a demultiplexer; the selector s13 connected to one of the pre-stage transmission pin sets Ptf13 and N (e.g. 2) of the post-stage reception pin sets Prr13 may be a multiplexer. Besides, each set of the pre-stage reception pin sets Prf13, the pre-stage transmission pin sets Ptf13, the post-stage reception pin sets Prr13 and the post-stage reception pin sets Ptr13 correspond to any one of the selectors s13. That is, every pin set only corresponds to one selector, and does not correspond to multiple selectors s13 at the same time. According to the structure of the redriver chip 13 shown in FIG. 3, merely one redriver chip with the above-mentioned transmission-reception alternate structure needs to be set up to enable the processor being capable to exchange the signals with the downstream device. In addition, because TX lines in the same type are separated by the RX lines in the different type from the TX lines, the FEXT is drastically decreased. It should be noted that the positions of the pin sets are not limited in this invention. The positions of the pin sets may be disposed on either end of the redriver chip 13 according to the layout design.

Besides, as shown in FIG. 1, the term "pin set" in this disclosure may include two pins because the TX line or the RX line requires two single-ended signal lines to transmit or receive single-frequency signals with the same voltage amplitude but different phases. However, the amount of the pins is not limited in this invention. As long as there is a redriver chip that has the structure in which the transmission pin sets and the reception pin sets are arranged alternately, and/or the structure in which multiple demultiplexers and multiple multiplexers are arranged alternately, it can be regarded as having the features of this invention, and conforming to the spirit of this invention.

Figure 4:
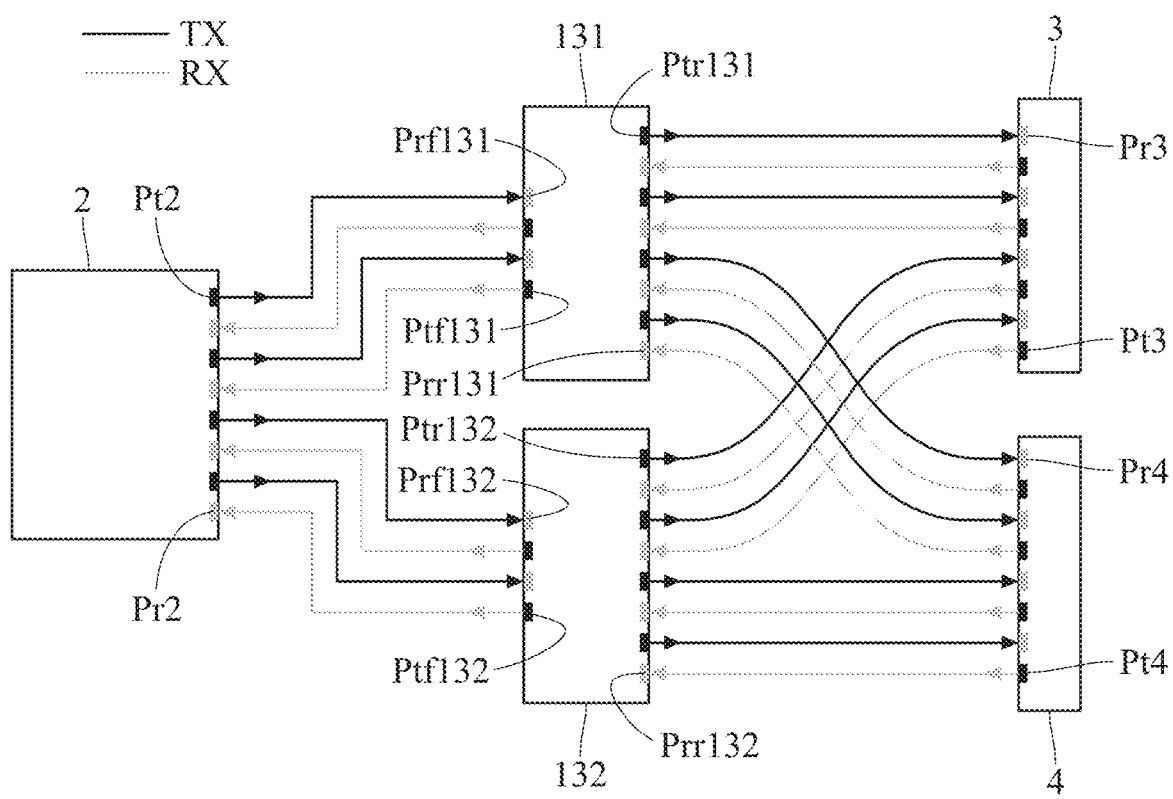
FIG. 4 is a schematic diagram of a multiplex control device having redriver chips of FIG. 3 according to an embodiment of this invention.

Please refer to FIG. 4, which is a schematic diagram of a multiplex control device having two redriver chips of FIG. 3 according to an embodiment of this invention. It should be noted that a single redriver chip 13 can complete the signal transmission between the processor and the downstream device. However, in order to compare with the structure of FIG. 2 easier, a first redriver chip 131 and a second redriver chip 132 that both include the same structure as the redriver chip 13 are illustrated as being disposed in the multiplex control device in FIG. 4. The structure of the first redriver chip 131 and the second redriver chip 132 may be the same, and the names of the components therein are also adaptively added with "first" or "second".

The multiplex control device shown in FIG. 4 includes: a processor 2, a first redriver chip 131, a second redriver chip 132, a first connecting port 3 and a second connecting port 4. The structures of the processor 2, the first connecting port 3, and the second connecting port 4 may be the same as those shown in FIG. 2, so they may not be repeated here. The difference from the structure of FIG. 2 is that since the first redriver chip 131 and the second redriver chip 132 are both capable to send/receive the pre-stage signals and post-stage signals, the signal transmission sequence may be slightly different as follows: the processor 2 may transmit the pre-stage signals to the first pre-stage reception pin sets Prf131 of the first redriver chip 131 and the second pre-stage transmission pin sets Prf132 of the second redriver chip 132 by the processing transmission pin sets Pt2, and then the pre-stage signals may be transmitted by either the first post-stage transmission pin sets Ptr131 of the first redriver chip 131 or the second post-stage transmission pin sets Ptr132 of the second redriver chip 132 to the first secondary reception pin sets Pr3 of the first connecting port 3 or the second secondary reception pin sets Pr4 of the second connecting port 4 selectively. In addition, the first connecting port 3 and the second connecting port 4 may respectively transmit the post-stage signals to the first post-stage reception pin sets Prr131 of the first redriver chip 131 and the second post-stage reception pin sets Prr132 of the second redriver chip 132 by the first secondary transmission pin sets Pt3 and the second secondary transmission pin sets Pt4, and then the post-stage signals may be transmitted from the first pre-stage transmission pin sets Ptf131 of the first redriver chip 131 and the second pre-stage transmission pin sets Ptf132 of the second redriver chip 132 to the processing reception pin sets Pr2 of the processor 2.

Accordingly, the alternate arrangement structure of the multiplex control device having redriver chip in an embodiment of this invention makes it unnecessary, in the practical layout design, to perform layering in order to centrally arrange the same type signal lines between the processor 2 and the redriver chip, or decreases the difficulty of the layering. Moreover, the layouts between the redriver chip and the first connecting port 3, and between the redriver chip and the second connecting port 4 are also much simpler. If the layering of the layout between the redriver chip and the connecting ports is performed for further decreasing the FEXT, its design is also simpler than the design of the layering in the conventional structure.

Figure 5:
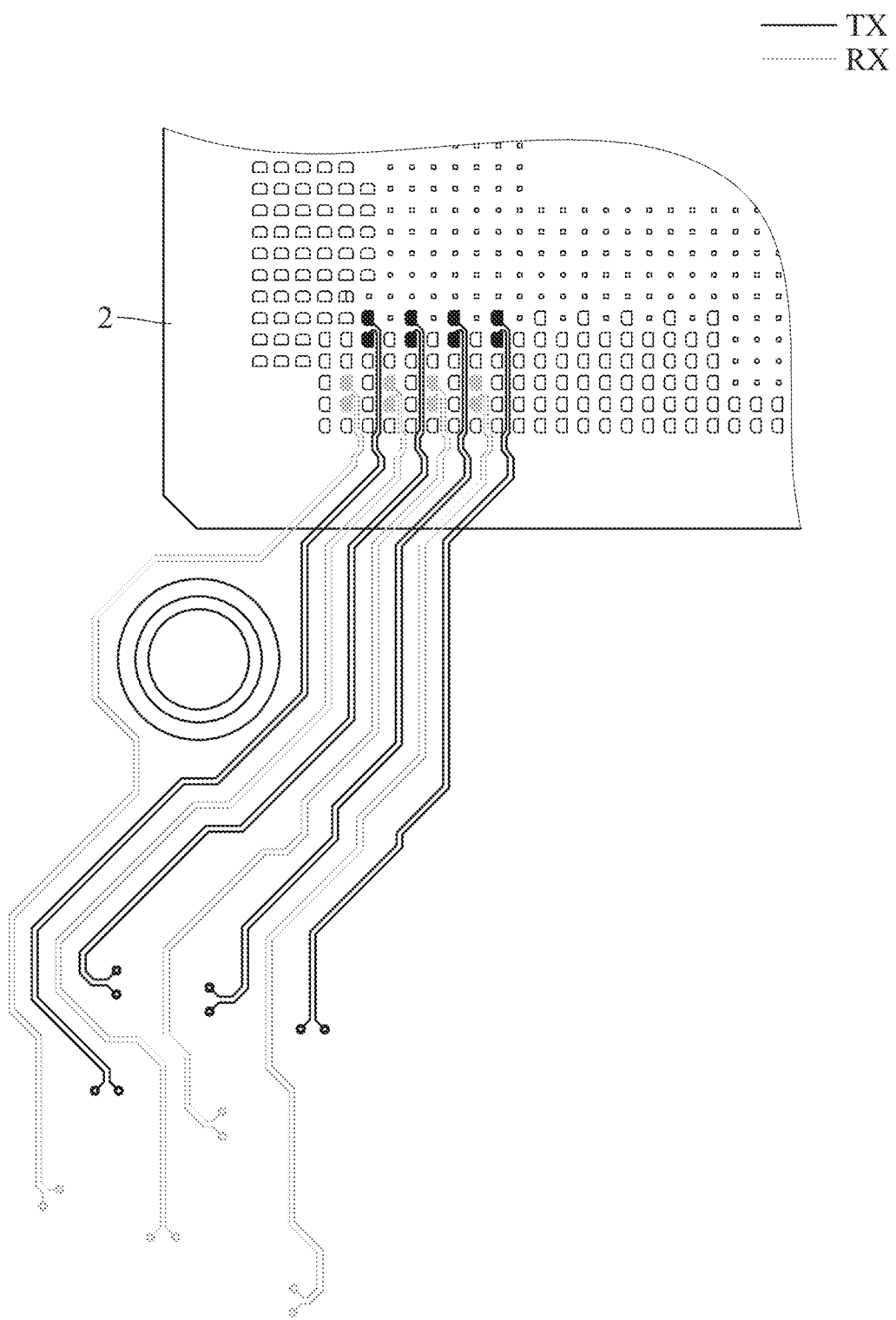
FIG. 5 is a layout diagram of a multiplex control device having redriver chips according to an embodiment of this invention.
Figure 6:
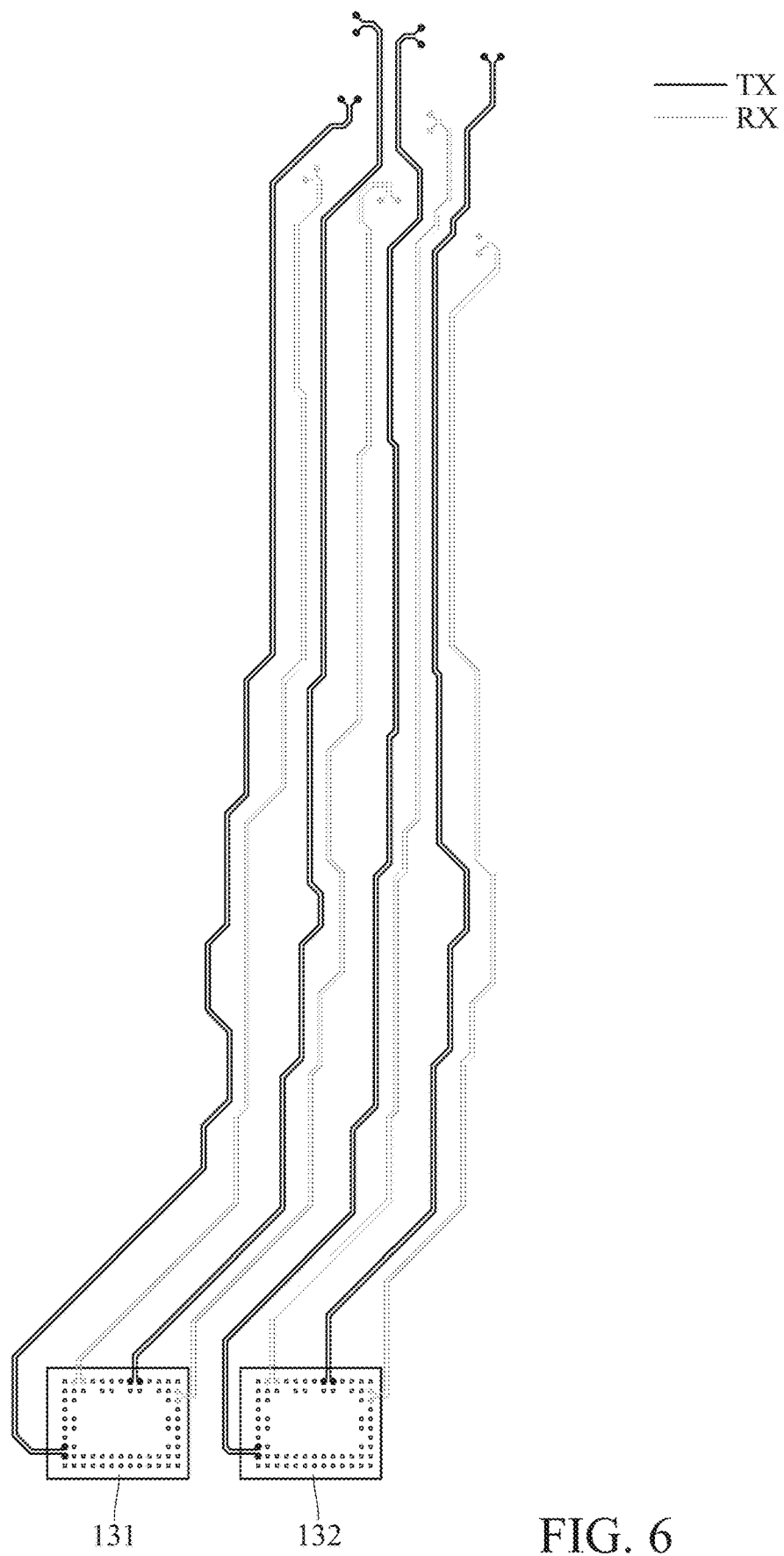
FIG. 6 is a layout diagram of a multiplex control device having redriver chips according to another embodiment of this invention.

Please refer to FIGS. 5 and 6, wherein FIG. 5 is a diagram of a multiplex control device having redriver chips according to an embodiment of this invention that shows the top layer of the layout structure, and FIG. 6 is a diagram of a multiplex control device having redriver chips according to another embodiment of this invention that shows the bottom layer of the layout structure. In order to easier describe and focus on the features to be emphasized in this invention, only the layout structure between the processor 2 and the two redriver chips 131 and 132 is shown in FIGS. 5 and 6, and the shown layering is resulted from the layout design, but is not necessary in practice. The concentric circles in FIG. 5 are drawn truthfully to represent the screw holes, and are not the focus of this invention. According to the pins on the processor 2 in FIG. 5, it may be found that one processing transmission pin set (shown as black blocks) includes two pins each of which is connected to a thin black line, and the two thin black lines can be regarded as a transmission line (TX). In addition, one processing reception pin sets (shown as gray blocks) also includes two pins each of which is connected to a thin gray line, and the two thin gray lines can be regarded as a reception line (RX). According to the layout structure in FIG. 5, it may be directly observed that the processing transmission pin sets and the processing reception pin sets of the processor 2 are alternately arranged, and the extended TX lines and the RX lines are also alternately arranged.

FIG. 6 shows the situation of how the TX lines and the RX lines are connected to the first redriver chip 131 and the second redriver chip 132. The TX lines composed of two thin black lines are connected to the two pins in the pre-stage reception pin sets of the first redriver chip 131 and the second redriver chip 132 (shown as the black block) and the RX lines composed of two gray lines are connected to the two pins in the pre-stage transmission pin sets of the first redriver chip 131 and the second redriver chip 132 (shown as gray blocks), wherein the pre-stage reception pin sets and the pre-stage transmission pin sets of each redriver chip are arranged alternately.

In addition, FIGS. 5 and 6 show the situation with two redriver chips, the first redriver chip 131 and the second redriver chip 132. Alternatively, the amount of redriver chips may be 1 or more than 2 (such as 4, 6, etc.), depending on the layout design. This invention does not limit the amount of redriver chips and the amount of pin sets that the redriver chips have.

Figure 7:
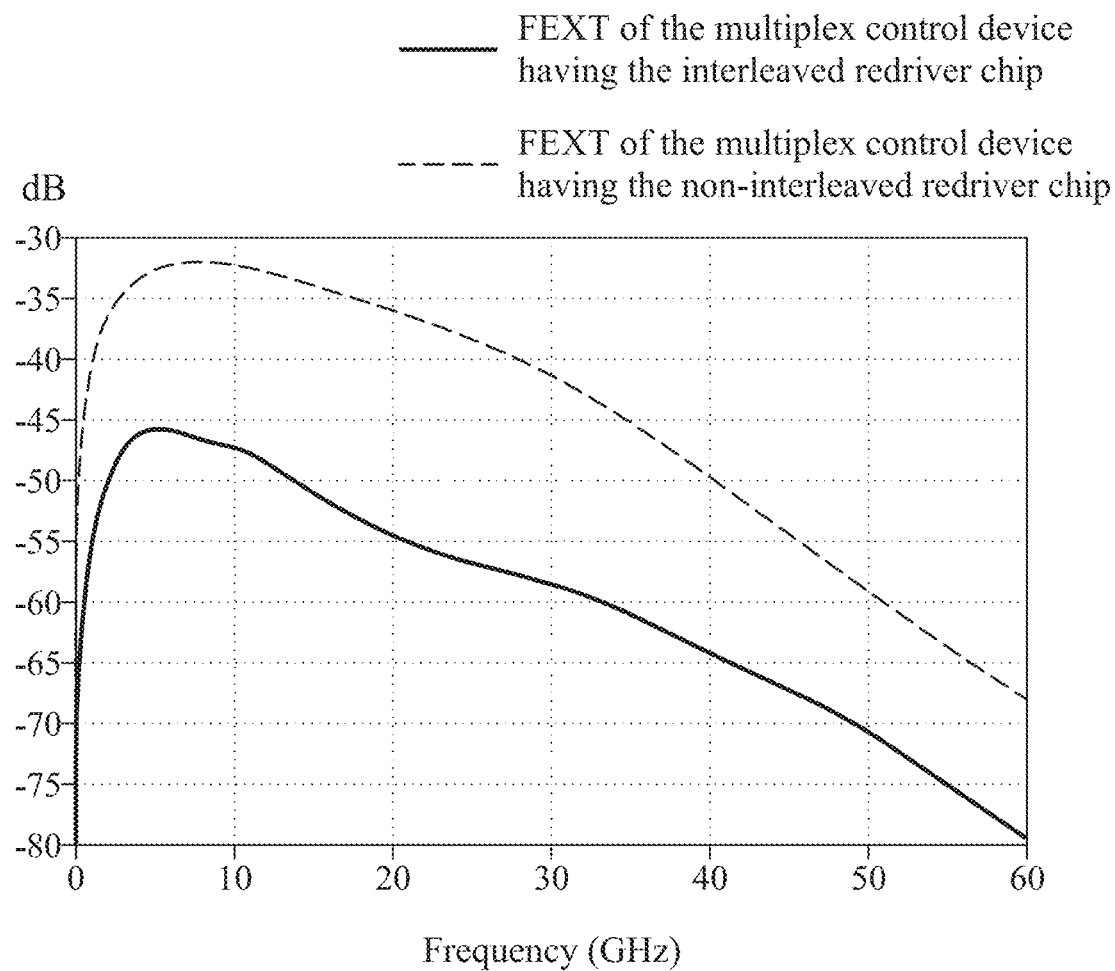
FIG. 7 is a schematic diagram showing the comparison of the far-end crosstalk generated by the multiplex control device having the interleaved redriver chip according to an embodiment of this invention and the far-end crosstalk generated by the multiplex control device having the conventional non-interleaved redriver chip.

Please refer to FIG. 7, which is a schematic diagram showing the comparison of the far-end crosstalk generated by the multiplex control device having the interleaved redriver chip according to an embodiment of this invention and the far-end crosstalk generated by the multiplex control device having the conventional non-interleaved redriver chip. Herein, the conventional redriver chip is defined as "non-interleaved redriver chip", and the redriver chip in the embodiments of this invention is defined as "interleaved redriver chip". The figure shows the amplitudes (the unit is decibel (dB)) of the FEXT, obtained during the experiment, caused by the signal lines of the multiplex control device having the conventional non-interleaved redriver chip and caused by the signal lines of the multiplex control device having the interleaved redriver chip under different frequencies (the unit is GHz). As shown in the figure, the amplitude of the FEXT caused by the multiplex control device having the interleaved redriver chip is less than the amplitude of the FEXT caused by the multiplex control device having the conventional non-interleaved redriver chip when the frequency is in the range of 0 GHz to 60 GHz.

In view of the above description, the redriver chip includes the pin sets with alternate arrangement, so that the amplitude of the FEXT caused by transmission lines of the same type (in the same transmission direction) being too close may be dramatically decreased, and accordingly, the layout structure may be simplified or the amount of the layer may be decreased. Besides, as the result of the redriver chip in this disclosure including pre-stage transmission pin sets, pre-stage reception pin sets, post-stage transmission pin sets and post-stage reception pin sets, only one redriver chip aforementioned may be installed on the multiplex control device having the redriver chip, or more redriver chip aforementioned may be installed on the multiplex control device having the redriver chip as needed, so that the flexibility of layout may be improved.

What is claimed is:

1. A redriver chip, comprising:
a plurality of pre-stage reception pin sets, configured to receive a set of pre-stage signals from a pre-stage component;
a plurality of pre-stage transmission pin sets, configured to transmit a set of post-stage signals to the pre-stage component, wherein the plurality of pre-stage transmission pin sets and the plurality of pre-stage reception pin sets are arranged alternately;
a plurality of post-stage transmission pin sets, wherein an amount of the plurality of post-stage transmission pin sets is N times an amount of the plurality of the pre-stage reception pin sets, and part of the plurality of post-stage transmission pin sets are configured to transmit the set of pre-stage signals to one of a plurality of post-stage components;
a plurality of post-stage reception pin sets, wherein the amount of the plurality of post-stage reception pin sets is N times the amount of the plurality of the pre-stage transmission pin sets, part of the plurality of post-stage reception pin sets are configured to receive the set of post-stage signals from one of the plurality of post-stage component, and the plurality of post-stage reception pin sets and the plurality of post-stage transmission pin sets are arranged alternately; and
a plurality of selectors, wherein each of the plurality of selectors is connected to one of the plurality of pre-stage reception pin sets and N of the plurality of post-stage transmission pin sets, or is connected to one of the plurality of pre-stage transmission pin sets and N of the plurality of post-stage reception pin sets,
wherein each set of the plurality of pre-stage reception pin sets, the plurality of pre-stage transmission pin sets, the plurality of post-stage transmission pin sets and the plurality of post-stage reception pin sets corresponds to any one of the plurality of selectors, and N is an integer.

2. The redriver chip according to claim 1, wherein the plurality of selectors comprise a plurality of multiplexers and a plurality of demultiplexers, and the plurality of multiplexer and the plurality of demultiplexer are arranged alternately.

3. The redriver chip according to claim 1, wherein each of the plurality of pre-stage reception pin sets, each of the plurality of pre-stage transmission pin sets, each of the plurality of post-stage transmission pin sets and each of the plurality of post-stage reception pin sets comprises two pins.

4. A multiplex control device having a redriver chip, comprising:
a processor, comprising a plurality of processing transmission pin sets and a plurality of processing reception pin sets, wherein the plurality of processing transmission pin sets and the plurality of processing reception pin sets are arranged alternately;
a first connecting port, comprising a plurality of first secondary transmission pin sets and a plurality of first secondary reception pin sets, wherein the plurality of first secondary transmission pin sets and the plurality of first secondary reception pin sets are arranged alternately;
a second connecting port, comprising a plurality of second secondary transmission pin sets and a plurality of second secondary reception pin sets, wherein the plurality of second secondary transmission pin sets and the plurality of second secondary reception pin sets are arranged alternately; and
the redriver chip according to claim 1, wherein the processor serves as the pre-stage component, and the plurality of post-stage components comprise the first connecting port and the second connecting port,
wherein the processor transmits the set of pre-stage signals to the plurality of pre-stage reception pin sets by the plurality of processing transmission pin sets, and receives the set of post-stage signals from the plurality of pre-stage transmission pin sets by the plurality of processing reception pin sets, and
wherein the redriver chip transmits the set of pre-stage signals to the plurality of first secondary reception pin sets or the plurality of secondary reception pin sets by the part of the plurality of the post-stage transmission pin sets, and receives the set of post-stage signals from the plurality of first secondary transmission pin sets or the plurality of second secondary transmission pin sets by the part of the plurality of post-stage reception pin sets.

5. The multiplex control device having the redriver chip according to claim 4, wherein each pin set of the plurality of processing transmission pin sets, the plurality of processing reception pin sets, the plurality of pre-stage reception pin sets, the plurality of pre-stage transmission pin sets, the plurality of post-stage reception pin sets, the plurality of post-stage transmission pin sets, the plurality of first secondary transmission pin sets, the plurality of first secondary reception pin sets, the plurality of second secondary transmission pin sets and the plurality of second secondary reception pin sets comprises two pins.

6. The multiplex control device having the redriver chip according to claim 4, wherein the plurality of processing transmission pin sets are defined as first processing transmission pin sets, the plurality of processing reception pin sets are defined as first processing reception pin sets, the redriver chip is defined as a first redriver chip, the plurality of pre-stage reception pin sets are defined as first pre-stage reception pin sets, the plurality of pre-stage transmission pin sets are defined as first pre-stage transmission pin sets, the plurality of post-stage transmission pin sets are defined as first post-stage transmission pin sets, and the plurality of post-stage reception pin sets are defined as first post-stage reception pin sets,
wherein the multiplex control device having the redriver chip further comprises a second redriver chip whose structure is the same as a structure of the redriver chip according to claim 1, and the second redriver chip is corresponding to the first redriver chip and therefore comprises a plurality of second pre-stage reception pin sets, a plurality of second pre-stage transmission pin sets, a plurality of second post-stage transmission pin sets and a plurality of second post-stage reception pin sets,
wherein the processor further comprises a plurality of second processing transmission pin sets and a plurality of second processing reception pin sets, and the plurality of second processing transmission pin sets and the plurality of second processing reception pin sets are arranged alternately, wherein the processor transmits another set of pre-stage signals to the plurality of second pre-stage reception pin sets by the plurality of the second processing transmission pin sets, and receives another post-stage signals from the plurality of pre-stage transmission pin sets by the plurality of second processing reception pin sets, wherein the second redriver chip transmits the said another set of pre-stage signals to the plurality of first secondary reception pin sets or the plurality of second secondary reception pin sets by part of the plurality of second post-stage transmission pin sets, and receives the said another set of post-stage signals from the plurality of first secondary transmission pin sets or the plurality of second secondary transmission pin sets by a part of the plurality of second post-stage reception pin sets.

* * * * *